(12) United States Patent
Jang et al.

(10) Patent No.: US 6,849,468 B2
(45) Date of Patent: Feb. 1, 2005

(54) METHOD FOR MANUFACTURING FERROELECTRIC RANDOM ACCESS MEMORY CAPACITOR

(75) Inventors: In-Woo Jang, Ichon-shi (KR); Jin-Yong Seong, Ichon-shi (KR); Kye-Nam Lee, Ichon-shi (KR); Suk-Kyoung Hong, Ichon-shi (KR)

(73) Assignee: Hynix Semiconductor Inc. (KR)

( * ) Notice: Subject to any disclaimer, the term of this patent is extended or adjusted under 35 U.S.C. 154(b) by 0 days.

(21) Appl. No.: 10/730,966

(22) Filed: Dec. 8, 2003

(65) Prior Publication Data
US 2004/0266029 A1 Dec. 30, 2004

(30) Foreign Application Priority Data
Jun. 30, 2003 (KR) ................ 10-2003-0043035

(51) Int. Cl.⁷ .............................. H01L 21/00
(52) U.S. Cl. ............... 438/3; 438/240; 438/250; 438/393
(58) Field of Search .............. 438/3, 240, 250, 438/393

(56) References Cited

U.S. PATENT DOCUMENTS

| | | | |
|---|---|---|---|
| 6,022,774 A | * | 2/2000 | Kawai et al. ............... 438/240 |
| 6,156,623 A | | 12/2000 | Hendrix et al. |
| 6,440,754 B2 | | 8/2002 | Hayashi et al. |
| 6,514,835 B1 | | 2/2003 | Hendrix et al. |
| 6,548,343 B1 | | 4/2003 | Summerfelt et al. |
| 6,576,546 B2 | | 6/2003 | Gilbert et al. |
| 6,677,217 B2 | * | 1/2004 | Joo et al. ............... 438/398 |

* cited by examiner

Primary Examiner—Jack Chen
(74) Attorney, Agent, or Firm—Blakely Sokoloff Taylor & Zafman

(57) ABSTRACT

The method for manufacturing an FeRAM capacitor having an enhanced adhesive property between a dielectric layer and a bottom electrode and a grain uniformity of the dielectric layer, is employed by forming hillocks on the bottom electrode purposefully before formation of the dielectric layer. The method includes steps of: preparing an active matrix obtained by predetermined processes; forming a first bottom electrode on the active matrix; forming a third ILD on exposed surfaces of the first bottom electrode and the second ILD; planarizing the third ILD till a top face of the first bottom electrode is exposed; forming a second bottom electrode on a top face of the bottom electrode; carrying out a first annealing process for deforming a surface of the second bottom electrode; forming a dielectric layer on exposed surfaces of the first bottom electrodes, the second bottom electrode and the third ILD; carrying out a second annealing process; and forming a top electrode on the dielectric layer.

14 Claims, 11 Drawing Sheets

METHOD FOR MANUFACTURING FERROELECTRIC RANDOM ACCESS MEMORY CAPACITOR

FIELD OF THE INVENTION

The present invention relates to a method for manufacturing a semiconductor device; and, more particularly, to a method for manufacturing a ferroelectric random access memory (FeRAM) capacitor having an improved adhesive property between a bottom electrode and a dielectric layer and a grain uniformity of the dielectric layer.

DESCRIPTION OF THE PRIOR ART

With the recent progress of film deposition techniques, researches for a nonvolatile memory cell using a ferroelectric thin film have increasingly been developed. This nonvolatile memory cell is a high-speed rewritable nonvolatile characteristic utilizing the high-speed polarization/inversion and the residual polarization of a ferroelectric capacitor thin film.

Therefore, a ferroelectric random access memory (FeRAM) where a ferroelectric material such as strontium bismuth tantalate (SBT) and lead zirconium titanate (PZT) is increasingly used for the capacitor thin film in place of a conventional silicon oxide film or a silicon nitride film, because it assures a low-voltage and high-speed performance, and further, does not require a periodic refresh to prevent loss of information during standby intervals like a dynamic random access memory (DRAM).

Since a ferroelectric material has a high dielectric constant ranging from hundreds to thousands value and a stabilized residual polarization property at a room temperature, it is being applied to the FeRAM device as the capacitor thin film. In case of employing the FeRAM device, information data are stored by polarization of dipoles when electric field is applied thereto. Even if electric field is removed, the residual polarization becomes still remained so that one of information data, i.e., "0" or "1", can be stored.

There are provided in FIGS. 1A to 1G cross sectional views setting forth a conventional method for manufacturing an FeRAM capacitor. It should be noted that like parts appearing in FIGS. 1A to 1G are represented by like reference numerals.

Referring to FIG. 1A, the conventional method for manufacturing the FeRAM capacitor begins with preparing an active matrix 100 including a semiconductor substrate 110, a transistor, a bit line 124, a first interlayer dielectric (ILD) 122, a second ILD 126 formed on the first ILD 122 and a storage node 128 embedded in the first ILD 122 and the second ILD 126. One of the diffusion regions 118 serves as a source and the other serves as a drain.

A detailed description for providing the active matrix 100 is as followings.

To begin with, the transistor is formed on the semiconductor substrate 110, wherein the transistor is provided with a gate insulator 114, a gate electrode 116 formed upon the gate insulator 114, spacers 120 disposed on sidewalls of a gate structure, an isolation region 112 for electrically isolating the transistor and diffusion regions 118 embedded in the semiconductor substrate 110.

After formation of the transistor, the first ILD 122 is formed over a resultant structure including the transistor and the semiconductor substrate 110. Then, the bit line 124 is formed for electrically being connected to the drain in order to apply an electrical voltage thereinto, after patterning the first ILD 122 into a first predetermined configuration. Although the bit line 124 actually extends in right and left directions bypassing the storage node 128, the drawing does not show these parts of the bit line 124 for the sake of convenience.

Thereafter, the second ILD 126 is formed on exposed surfaces of the first ILD 122 and the bit line 124, wherein the bit line 124 is embedded in the second ILD 126.

Subsequently, the second ILD 126 and the first ILD 122 are selectively etched into a second predetermined configuration, whereby a contact hole (not shown) is formed. The contact hole is filled with a predetermined conductive material so as to form the storage node 128 which is connected to the source/drain regions 118. Therefore, the preparation of the active matrix 200 is completed.

After preparing the active matrix 100, a first bottom electrode 130A is formed upon the storage node 128 and portions of the second ILD 126, as shown in FIG. 1B. In general, the first bottom electrode 130A employs iridium (Ir), platinum (Pt), tungsten (W), titanium (Ti), titanium nitride (TiN), titanium aluminum nitride (TiAlN), ruthenium oxide ($RuO_2$) or the like.

Thereafter, a third ILD 132 is formed on exposed surfaces of the first bottom electrode 130A and the second ILD 126 and is planarized till the top face of the first bottom electrode 130A is exposed by using a method such as a chemical mechanical polishing (CMP), a blanket etch process or the like. During a planarization of the third ILD 132, the height of the third ILD 132 will be unavoidably lower than that of the first bottom electrode 130A owing to a recess phenomenon of the third ILD 132, as shown in FIG. 1C.

In a subsequent step, referring to FIG. 1D, a second bottom electrode 130B is formed upon the top face of the first bottom electrode 130A so as to form a bottom electrode 130, wherein the second bottom electrode 130B uses a material such as Ir, Pt, W, Ti, TiN, TiAlN, $RuO_2$ and so on.

Subsequently, referring to FIG. 1E, a dielectric layer 134 is formed on exposed surfaces of a bottom electrode 130 and the third ILD 132 by using a method such as a spin coating technique or the like. The dielectric layer 134 employs a ferroelectric material such as strontium bismuth tantalate (SBT, ($SrBi_2Ta_2O_9$)), lead zirconium tantalate (PZT, ((Pb, Zr)$TiO_3$)), or the like. In particular, since the ferroelectric material has a crystal structure, it is important to select an appropriate material for the bottom electrode 130 in consideration of a grain growth of the dielectric layer 134 in a post thermal process. That is, it is preferred to utilize the bottom electrode 130 having a low electrical resistance, a small unconformity of a lattice parameter with respect to the ferroelectric material, a high thermal resistance, a good adhesive property with respect to an underlying structure and so on, for growing up the grains of the ferroelectric material uniformly.

In an ensuing step, a top electrode 136 is formed upon the dielectric layer 134, which is situated above the bottom electrode 130, as depicted in FIG. 1F.

After formation of the top electrode 136, an annealing process is carried out for recovering a ferroelectric property of the FeRAM capacitor. During the annealing process, there is a thermal expansion mismatch between the bottom electrode 130 and the dielectric layer 134 due to a difference of each coefficient of thermal expansion (CTE). Therefore, there is happened a hillock 140 on the bottom electrode 130 to relieve a thermal stress thereof incurred during the high temperature annealing process, as shown in FIG. 1G.

Referring to FIG. 2, there is shown a graph illustrating an exemplary stress curve of Pt/Ti electrode versus a temperature during the annealing process.

In FIG. 2, a dotted line shows an inherent stress curve of Pt and a solid line denotes a thermal stress curve of Pt actually experienced during a heating and a cooling steps. At points where two stress curve show a great difference, there is happened the hillock 140 on the bottom electrode 130 in order to relieve the thermal stress created during high temperature thermal process.

As described above, the prior art method for manufacturing the FeRAM capacitor suffers from a drawback that there is happened the hillock 140 on the bottom electrode 130 due to the thermal stress because the annealing process is carried out after the formation of the top electrode 136. If the hillock 140 is significant in size, it will penetrate through the dielectric layer 134, thereby incurring a shortage phenomenon. Even if the size of the hillock 140 is not significant enough, the dielectric layer 134 between the top and bottom electrodes 136, 132 at the location of the hillock 140 is highly stressed, increasing a leakage current, which diminishes the capacitance and may eventually result in a random failure of the FeRAM device.

SUMMARY OF THE INVENTION

It is, therefore, an object of the present invention to provide a method for manufacturing a ferroelectric random access memory (FeRAM) capacitor with an enhanced adhesive property between a dielectric layer of a ferroelectric material and a bottom electrode and a grain uniformity of the ferroelectric material by forming a hillock on the bottom electrode purposefully.

In accordance with one aspect of the present invention, there is provided a method for manufacturing a ferroelectric random access memory (FeRAM) capacitor, the method including the steps of: a) preparing an active matrix provided with a semiconductor substrate, a transistor, a bit line, a first interlayer dielectric (ILD), a second ILD and a storage node; b) forming a first bottom electrode on the active matrix; c) forming a third ILD on exposed surfaces of the first bottom electrode and the second ILD; d) planarizing the third ILD till a top face of the first bottom electrode is exposed; e) forming a second bottom electrode on a top face of the bottom electrode; f) carrying out a first annealing process for deforming a surface of the second bottom electrode; g) forming a dielectric layer on exposed surfaces of the first bottom electrodes, the second bottom electrode and the third ILD; h) carrying out a second annealing process; and i) forming a top electrode on the dielectric layer.

BRIEF DESCRIPTION OF THE DRAWINGS

The above and other objects and features of the present invention will become apparent from the following description of the preferred embodiments given in conjunction with the accompanying drawings, in which.

DETAILED DESCRIPTION OF THE PREFERRED EMBODIMENTS

Figure 1A:
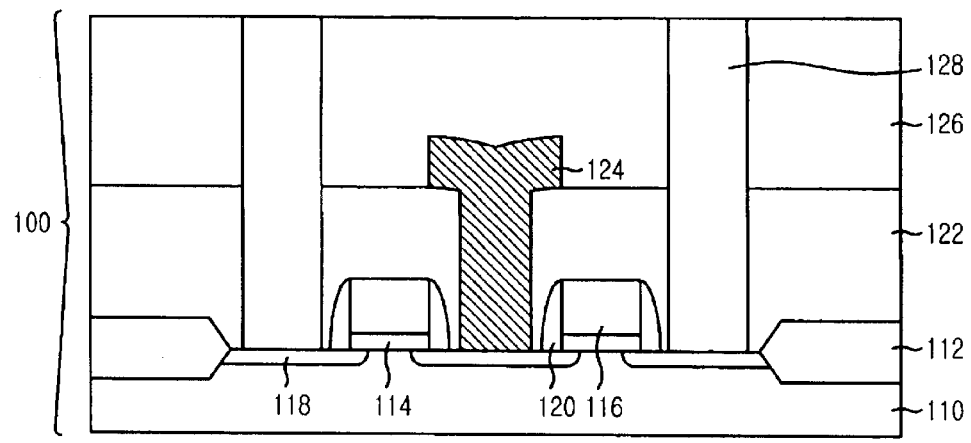
FIGS. 1A to 1G are cross sectional views setting forth a conventional method for manufacturing a ferroelectric random access memory (FeRAM) capacitor.
Figure 1B:
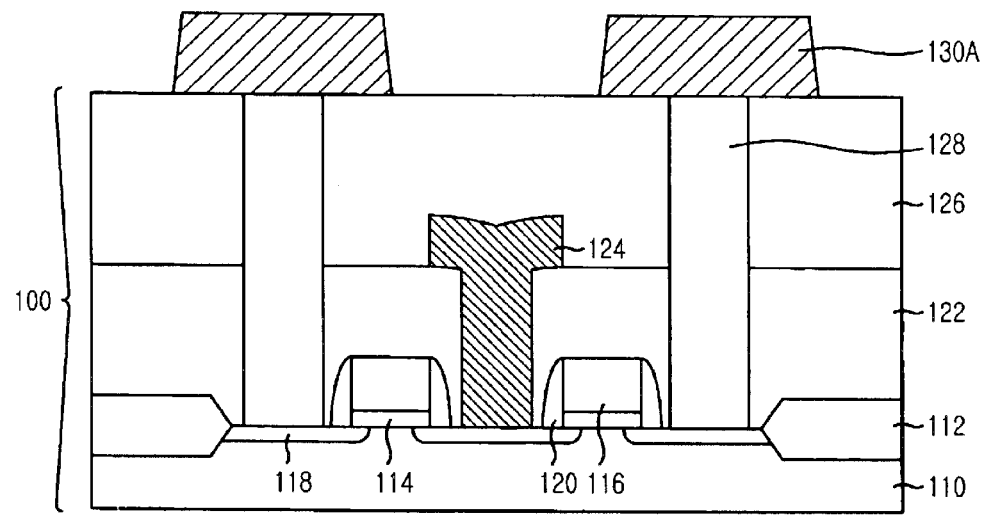
Figure 1C:
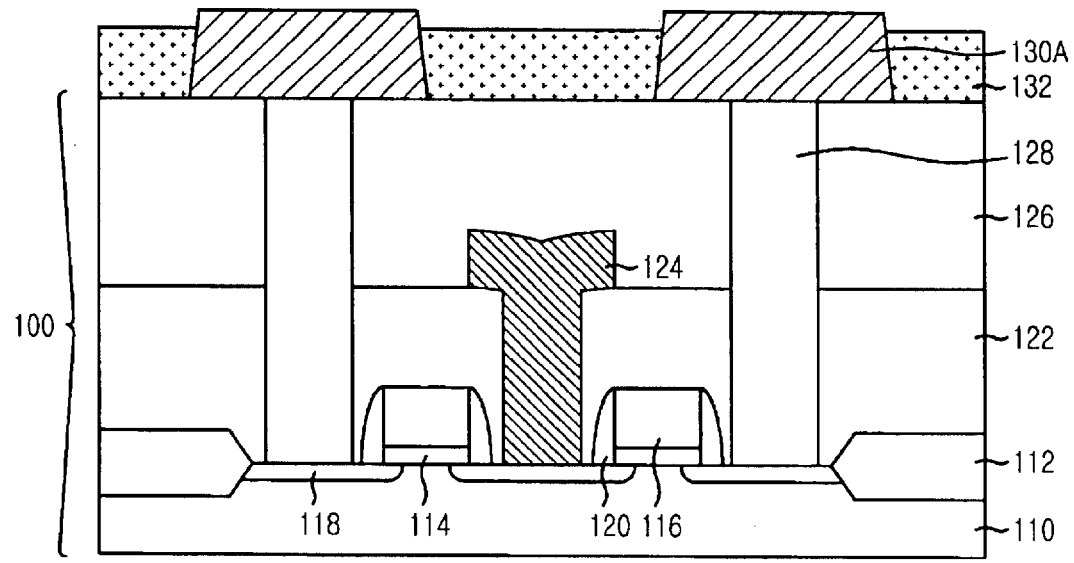
Figure 1D:
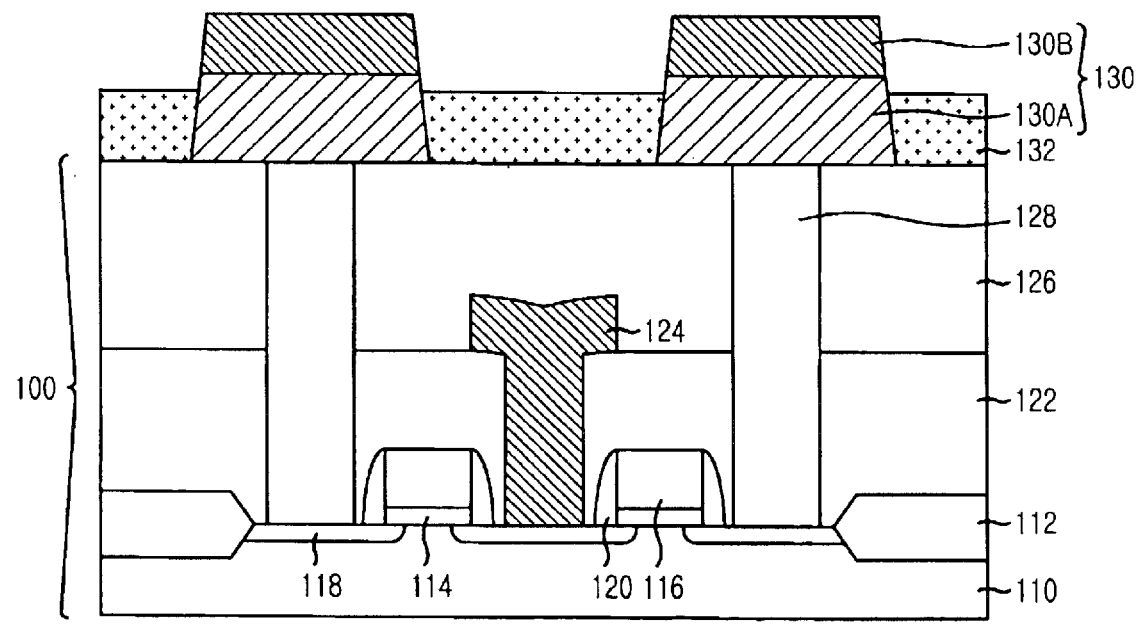
Figure 1E:
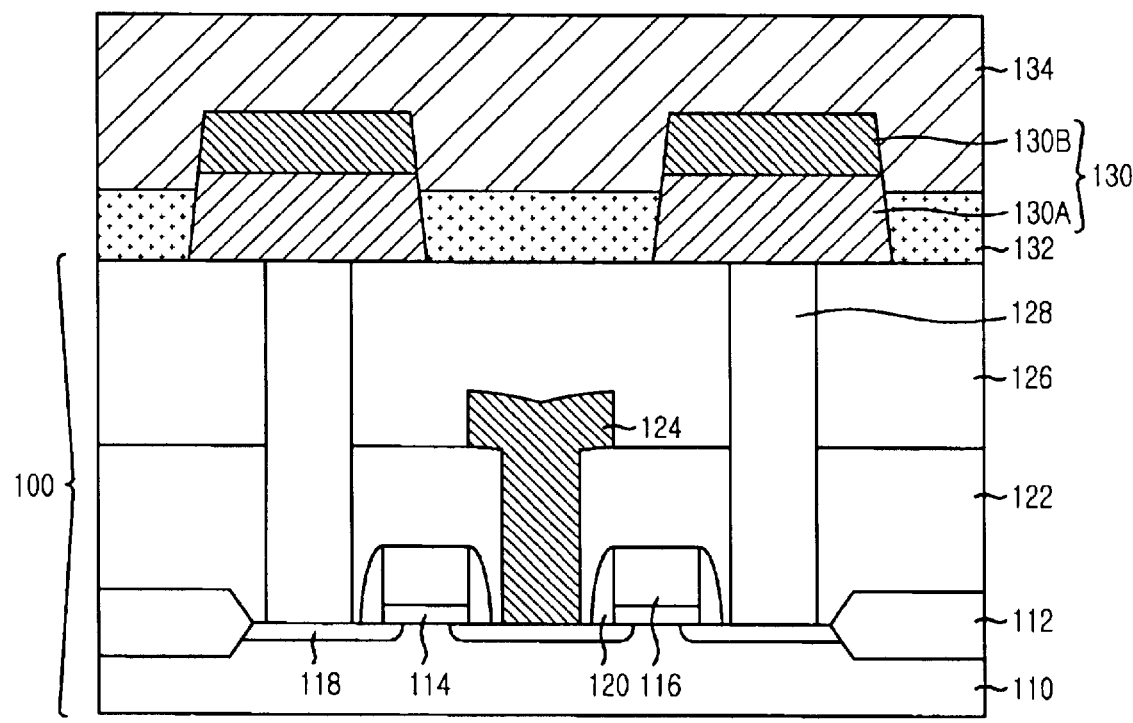
Figure 1F:
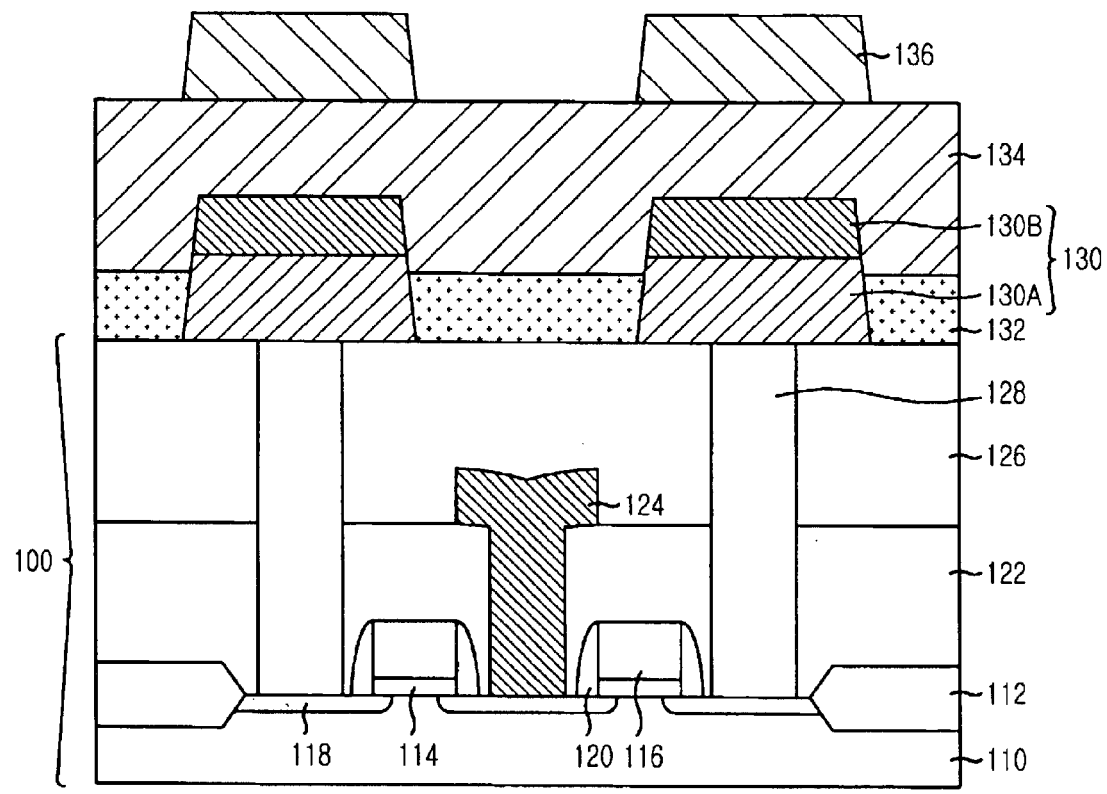
Figure 1G:
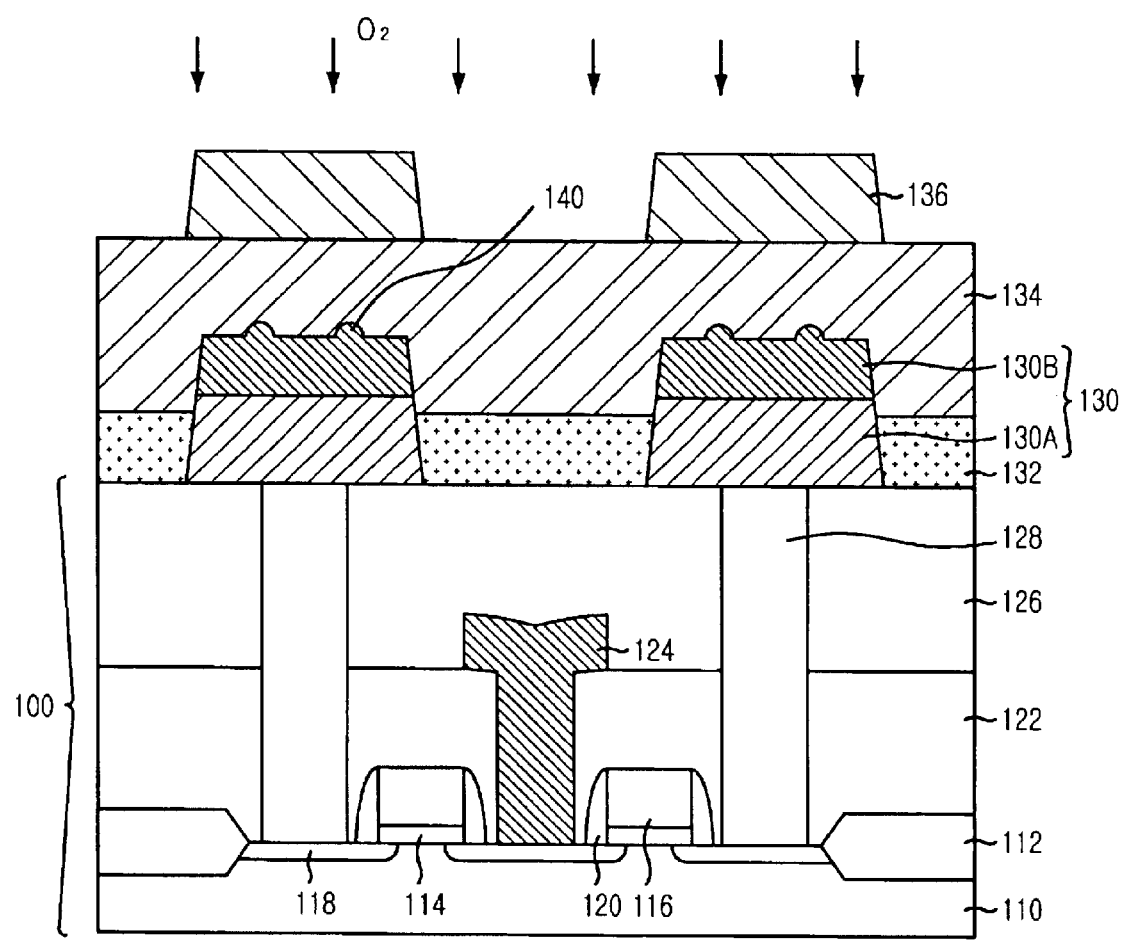
Figure 2:
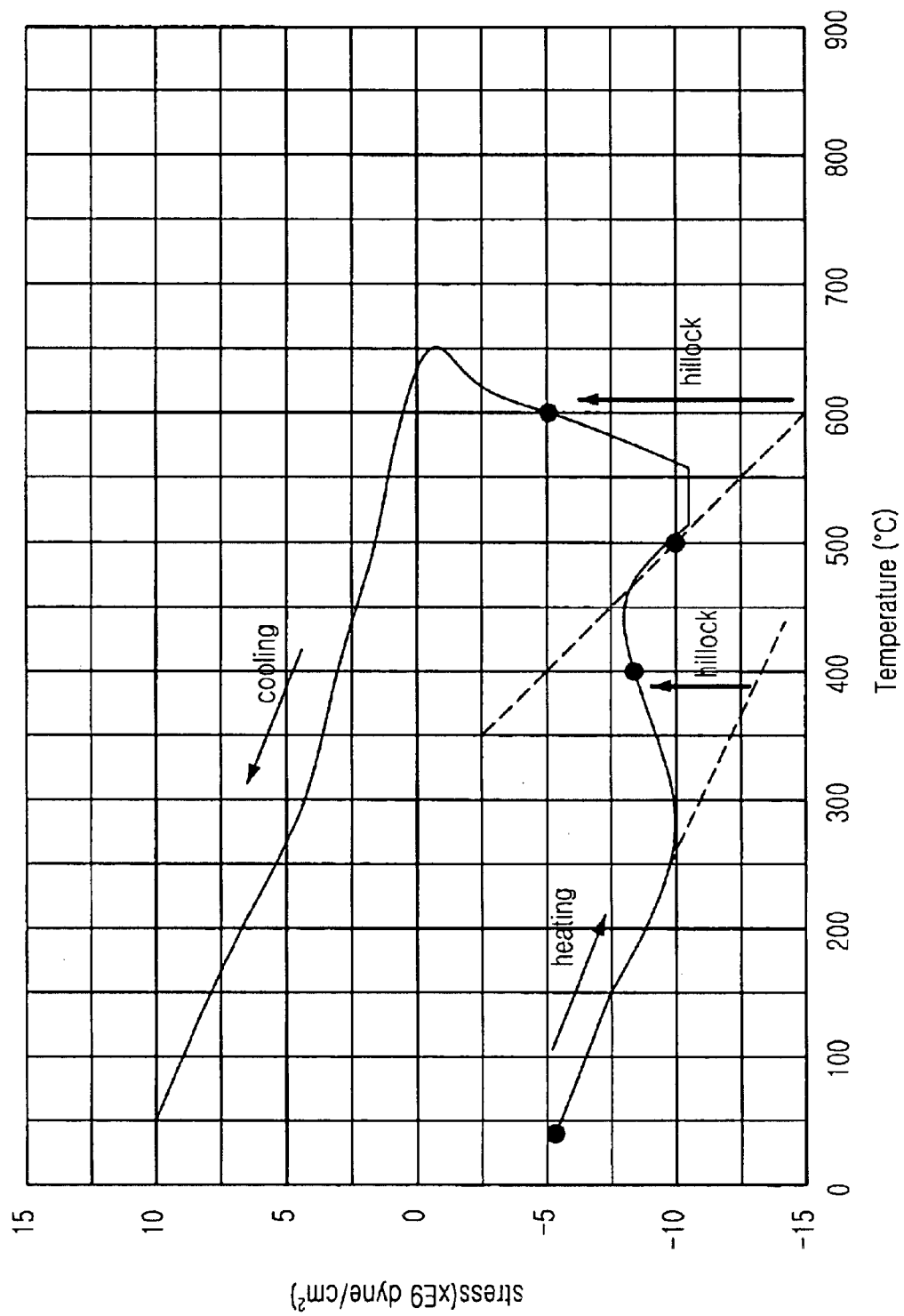
FIG. 2 is a graph illustrating an exemplary stress curve of a Pt/Ti electrode versus a temperature during an annealing process.

There are provided in FIGS. 3A to 3G cross sectional views setting forth a method for manufacturing a ferroelectric random access memory (FeRAM) capacitor in accordance with a preferred embodiment of the present invention. It should be noted that like parts appearing in FIGS. 3A to 3G are represented by like reference numerals.

Figure 3A:
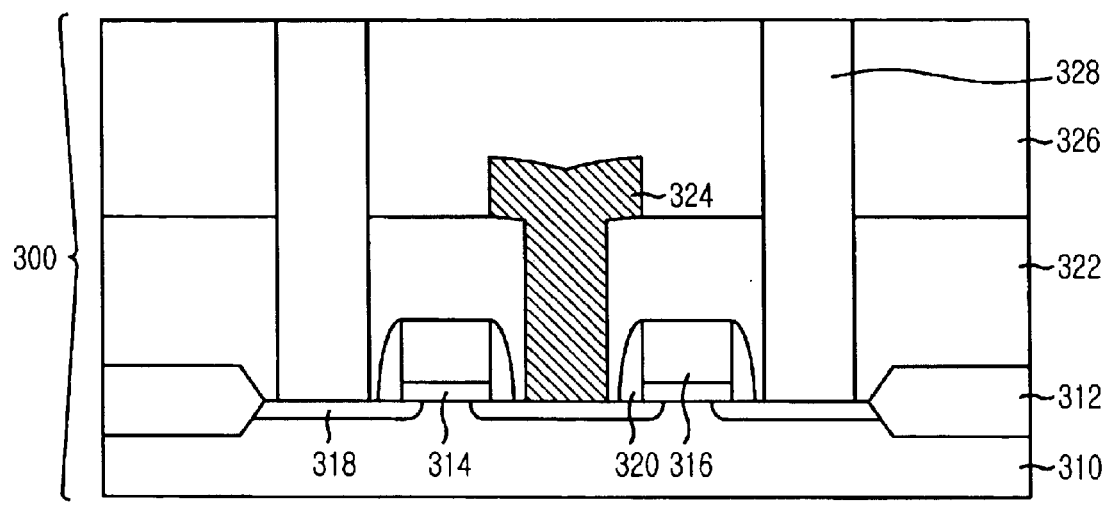
FIGS. 3A to 3G are cross sectional views setting forth a method for manufacturing an FeRAM capacitor with an enhanced adhesive property between a ferroelectric dielectric layer and a first bottom electrode in accordance with a preferred embodiment of the present invention.

Referring to FIG. 3A, a process for manufacturing the FeRAM capacitor begins with preparation of an active matrix 300 including a semiconductor substrate 310, a transistor, a bit line 324, a first ILD 322, a second ILD 326 formed on the first ILD 322 and a storage node 328 embedded in the first ILD 322 and the second ILD 326. One of the diffusion regions 318 serves as a source and the other serves as a drain.

A detailed description for providing the active matrix 300 is as followings.

To begin with, the transistor is formed on the semiconductor substrate 310, wherein the transistor is provided with a gate insulator 314, a gate electrode 316 formed upon the gate insulator 314, spacers 320 disposed on sidewalls of a gate structure, an isolation region 312 for electrically isolating the transistor and diffusion regions 318, the isolation region 318 being embedded in the semiconductor substrate 310.

After formation of the transistor, the first ILD 322 is formed on exposed surfaces of the transistor and the semiconductor substrate 310. Then, the bit line 324 is formed for electrically being connected to the drain in order to apply an electrical voltage thereinto, after patterning the first ILD 322 into a first predetermined configuration. Although the bit line 324 actually extends in right and left directions bypassing the storage node 328, the drawing does not show these parts of the bit line 324 for the sake of convenience.

Thereafter, the second ILD 326 is formed on exposed surfaces of the first ILD 322 and the bit line 324, wherein the bit line 324 is embedded in the second ILD 326.

Subsequently, the second dielectric 326 and the first ILD 322 are etched into a second predetermined configuration, whereby a contact hole (not shown) is formed. Then, the contact hole is filled with a predetermined conductive material so as to form the storage node 328 which is connected to the source/drain regions 318. Therefore, the preparation of the active matrix 300 is completed.

Figure 3B:
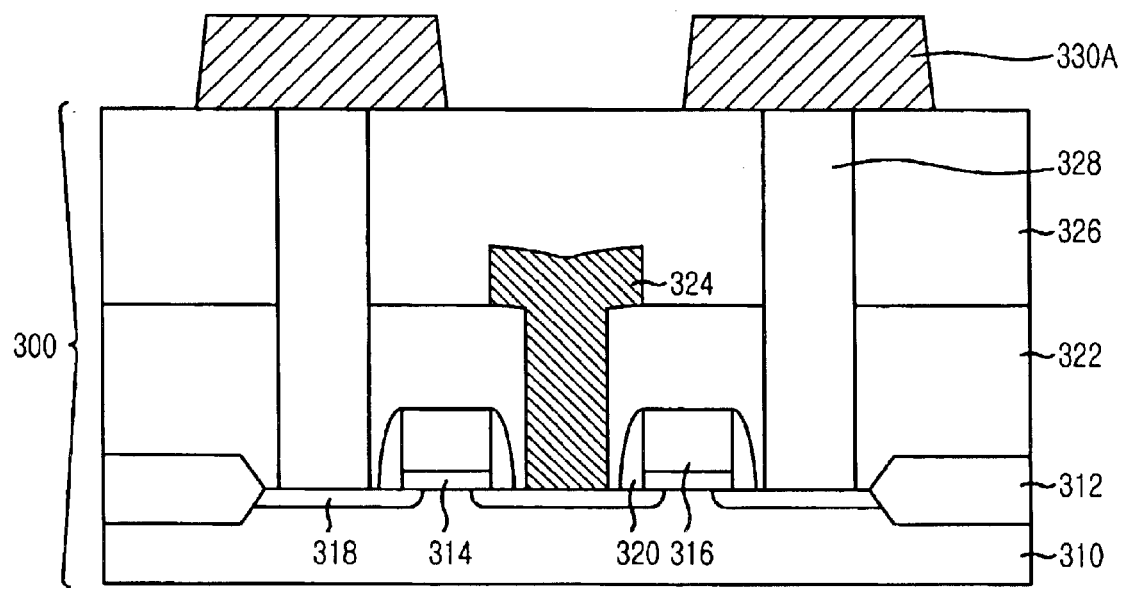

Referring to FIG. 3B, after preparing the active matrix 300, a first bottom electrode 330A is formed upon a top face of the storage node 328 and portions of the second ILD 326.

Figure 3C:
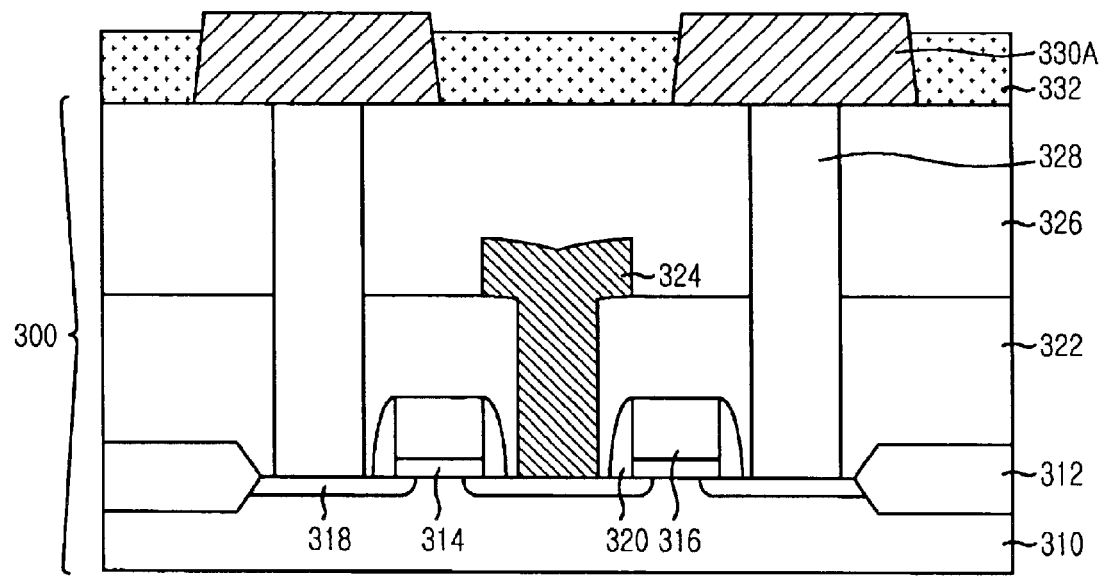

Thereafter, a third ILD 332 is formed on exposed portions of the second ILD 326 and the first bottom electrode 330A and is planarized till the top face of the first bottom electrode 330A is exposed by using a method such as a chemical mechanical polishing (CMP), a blanket etch process or the like. In general, during a planarization of the third ILD 332, the height of the third ILD 332 will be unavoidably lower than that of the first bottom electrode 330A owing to a recess phenomenon of the third ILD 332, as shown in FIG. 3C.

Figure 3D:
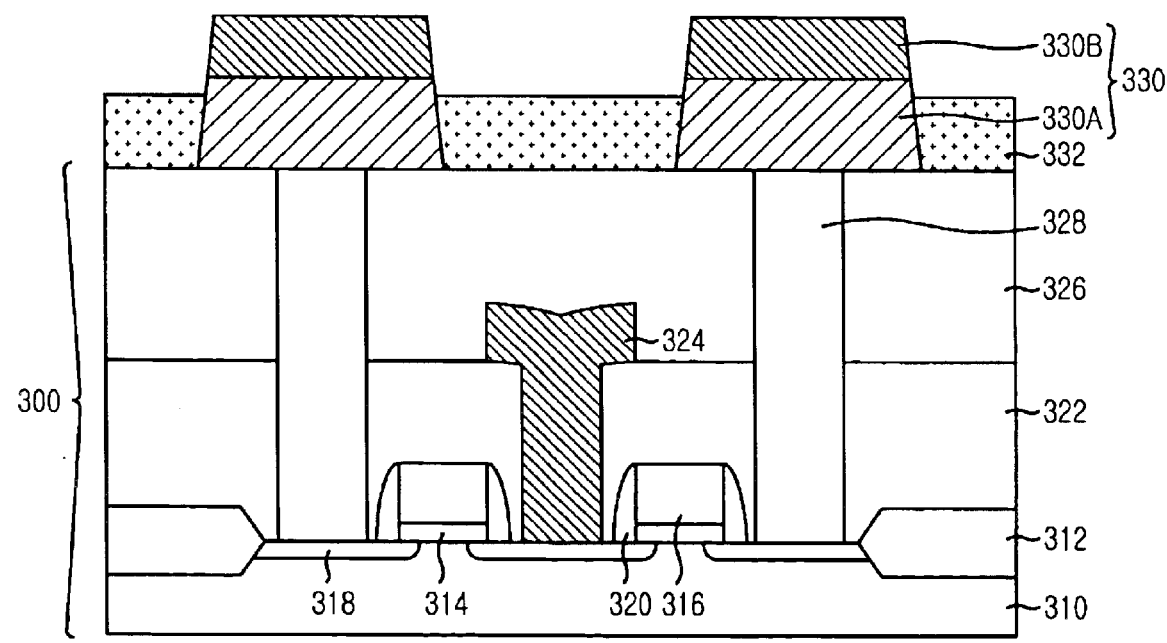

In an ensuing step, a second bottom electrode 330B is formed upon the top face of the first bottom electrode 330A as shown in FIG. 3D. Here, the first bottom electrode 330A can be a single layer or multi-layers employing a material such as platinum (Pt), iridium (Ir), iridium oxide ($IrO_x$), ruthenium (Ru), rhenium (Re), rhodium (Rh), tungsten (W), titanium (Ti), titanium nitride (TiN), titanium aluminum nitride (TiAlN), ruthenium oxide ($RuO_2$) and a combination thereof.

Following the formation of the third ILD 332, a first annealing process is carried out in a same condition of a post annealing process for recovering ferroelectric properties of the FeRAM capacitor, in order to deform a surface of the bottom electrode 330. That is, the first annealing process is performed in oxygen ($O_2$) gas ambient for about an hour at a temperature above about 400° C. In the preferred embodiment of the present invention, the first annealing process was carried out at about 475° C.

Figure 3E:
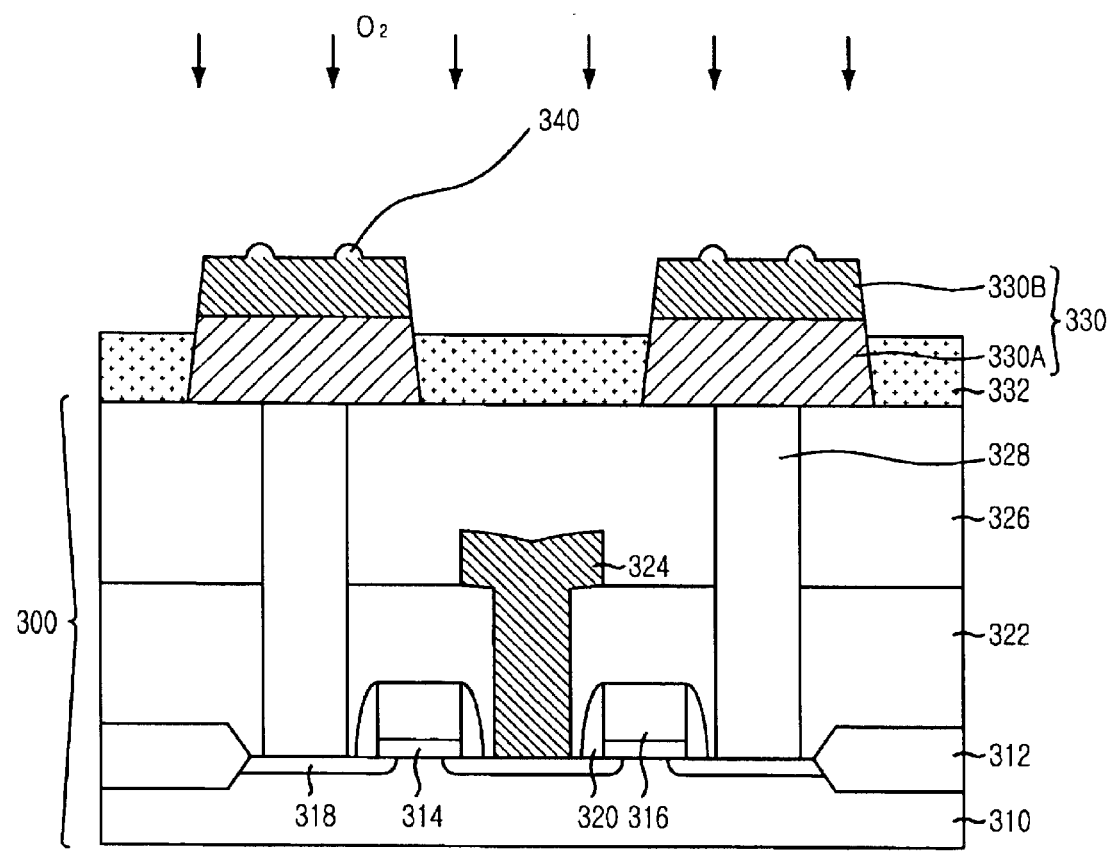

Thereafter, a rapid thermal process (RTP) may be carried out at the temperature ranging from about 400° C. to about 800° C. Since the first annealing process is carried out prior to the formation of the dielectric layer 334, it is possible to obtain the bottom electrode 330 having a hillock 340 thereon as depicted in FIG. 3E, due to a thermal stress of the bottom electrode 330 during the first annealing process. Since the hillock 340 is formed on the bottom electrode 330 purposefully the hillock 340 will be used as a seed layer for growing up grains of the dielectric layer 334, thereby achieving a grain growth uniformity of the dielectric layer 334 in a post annealing process.

Subsequently, referring to FIG. 3F, the dielectric layer 334 is formed on exposed surfaces of the bottom electrode 330 and the third ILD 332 by using a method such as a spin coating technique or the like, wherein the dielectric layer 332 employs a ferroelectric material with a perovskite structure or a layered perovskite structure such as strontium bismuth tantalate ($SrBi_2Ta_2O_9$, hereinafter referred to as SBT), La-modified bismuth titanate (($Bi,La)_4Ti_3O_{12}$, hereinafter referred to as BLT), lead zirconium titanate (($Pb,Zr$)$TiO_3$, hereinafter referred to as PZT) or the like.

Figure 3F:
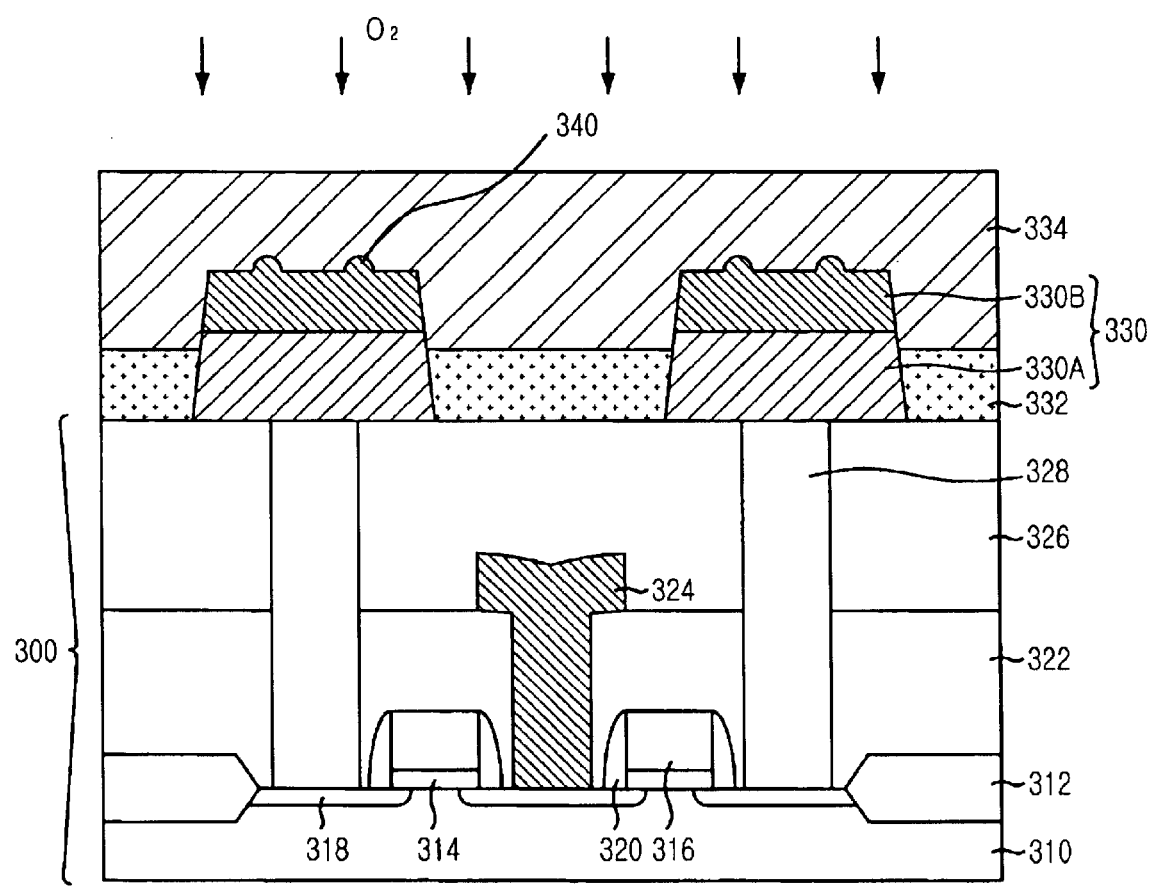

Thereafter, whole the resultant structure is subjected to a second annealing process for recovering the ferroelectric property, as shown in FIG. 3F. Since the thermal stress of the bottom electrode 330 is relived already in the first annealing process, an adhesive property between the bottom electrode 330 and the dielectric layer 334 becomes enhanced. The condition of the second annealing process is same to that of the first annealing process. Namely, the second annealing process is performed in oxygen ($O_2$) gas ambient for about an hour at a temperature in excess of about 400° C. Then, a rapid thermal process (RTP) may be carried out at the temperature ranging from about 400° C. to about 800° C.

Figure 3G:
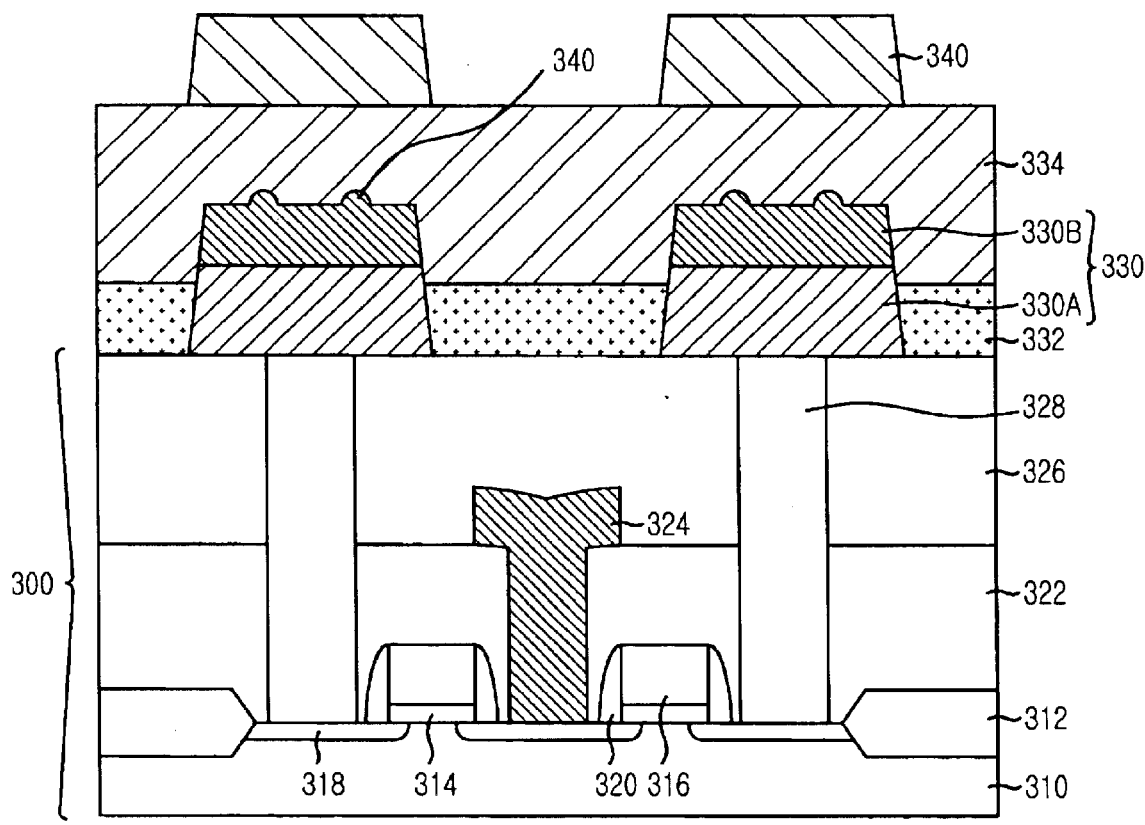

Finally, a top electrode 336 is formed upon the dielectric layer 334, which is situated above the bottom electrode 330, as depicted in FIG. 3G. The top electrode 336 can be a single layer or multi-layers employing a material selected from the group consisting of Pt, Ir, $IrO_x$, Ru, Re, Rh, W, Ti, $RuO_2$ and a combination thereof. Thus, the inventive process for manufacturing the FeRAM capacitor is completed.

In comparison with the prior art method, the hillock 340 is purposefully formed on the bottom electrode 330 by means of the first annealing process before the annealing process for recovering the ferroelectric properties, whereby the grains in the ferroelectric material of the dielectric layer 334 are grown up uniformly along the surface of the hillock 340. Therefore, the inventive method for manufacturing the FeRAM capacitor is effective in overcoming the problem associated with the hillock 340 formed on bottom electrode 330 during the annealing process of the ferroelectric material, which is a serious shortcoming according to the prior art method. Furthermore, it is possible to prevent its resulting detrimental impact on the FeRAM capacitor, as well as to provide an enhanced adhesive property between the bottom electrode and the dielectric layer. Thus, it is possible to secure the reliability of the FeRAM capacitor.

While the present invention has been described with respect to the particular embodiments, it will be apparent to those skilled in the art that various changes and modifications may be made without departing from the scope of the invention as defined in the following claims.

What is claimed is:

1. A method for manufacturing a ferroelectric random access memory (FeRAM) capacitor, the method comprising the steps of:

a) preparing an active matrix including a semiconductor substrate, a transistor, a bit line, a first interlayer dielectric (ILD), a second ILD and a storage node;

b) forming a first bottom electrode on the active matrix;

c) forming a third ILD on exposed surfaces of the first bottom electrode and the second ILD;

d) planarizing the third ILD until a top face of the first bottom electrode is exposed;

e) forming a second bottom electrode on a top face of the first bottom electrode;

f) carrying out a first annealing process for deforming a surface of the second bottom electrode in order to uniformly grow up grains in a dielectric layer along the surface of the second bottom electrode;

g) forming the dielectric layer on exposed surfaces of the first bottom electrode, the second bottom electrode and the third ILD;

h) carrying out a second annealing process; and i) forming a top electrode on the dielectric layer.

2. The method as recited in claim 1, wherein the step d) is carried out using a chemical mechanical polishing (CMP) technique.

3. The method as recited in claim 1, wherein the step d) is carried out using a blanket etch technique.

4. The method as recited in claim 1, wherein the step f) is carried out in an oxygen gas ambient for about an hour at a temperature in excess of about 400° C.

5. The method as recited in claim 4, after the step f), further comprising the step of carrying out a rapid thermal process (RTP) at a temperature ranging from about 400° C. to about 800° C.

6. The method as recited in claim 1, wherein the step h) is carried out in an oxygen gas ambient for about an hour at a temperature in excess of about 400° C.

7. The method as recited in claim 6, after the step h), further comprising the step of carrying out a rapid thermal process (RTP) at a temperature ranging from about 400° C. to about 800° C.

8. The method as recited in claim 1, wherein the first bottom electrode is a single layer employing a material selected from the group consisting of platinum (Pt), iridium (Ir), iridium oxide ($IrO_x$), ruthenium (Ru), rhenium (Re), rhodium (Rh), tungsten (W), titanium (Ti), titanium nitride (TiN), titanium aluminum nitride (TiAlN), ruthenium oxide ($RuO_2$) and a combination thereof.

9. The method as recited in claim 1, wherein the second bottom electrode is a single layer employing a material selected from the group consisting of platinum (Pt), iridium (Ir), iridium oxide ($IrO_x$), ruthenium (Ru), rhenium (Re), rhodium (Rh), tungsten (W), titanium (Ti), titanium nitride (TiN), titanium aluminum nitride (TiAlN), ruthenium oxide ($RuO_2$) and a combination thereof.

10. The method as recited in claim 1, wherein the dielectric layer uses a ferroelectric material selected from the group consisting of strontium bismuth tantalate ($SrBi_2Ta_2O_9$, SBT), La-modified bismuth titanate ($(Bi,La)_4Ti_3O_{12}$, BLT) and lead zirconium titanate ($(Pb,Zr)TiO_3$, PZT).

11. The method as recited in claim 10, wherein the ferroelectric material has a perovskite crystal structure.

12. The method as recited in claim 10, wherein the ferroelectric material has a layered perovskite crystal structure.

13. The method as recited in claim 1, wherein the top electrode is a single layer employing a material selected from the group consisting of Pt, Ir, $IrO_x$, Ru, Re, Rh, W, Ti, $RuO_2$ and a combination thereof.

14. The method as recited in claim 1, wherein the top electrode is multi-layers employing a material selected from the group consisting of Pt, Ir, $IrO_x$, Ru, Re, Rh, W, Ti, $RuO_2$ and a combination thereof.

* * * * *